(12) United States Patent
Liaw

(10) Patent No.: US 7,502,273 B2
(45) Date of Patent: Mar. 10, 2009

(54) TWO-PORT SRAM WITH A HIGH SPEED SENSING SCHEME

(75) Inventor: Jhon Jhy Liaw, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 11/527,966

(22) Filed: Sep. 27, 2006

(65) Prior Publication Data
US 2008/0080230 A1     Apr. 3, 2008

(51) Int. Cl.
*G11C 7/02* (2006.01)
(52) U.S. Cl. .................. 365/210.15; 365/202; 365/207; 365/196; 365/189.07; 365/210.1
(58) Field of Classification Search ............ 365/210.15, 365/210.1, 202, 207, 196, 189.07
See application file for complete search history.

(56) References Cited

U.S. PATENT DOCUMENTS 7,164,601 B2 *   1/2007   Mitani et al. ............ 365/185.03
7,281,094 B2 *  10/2007   Ham ........................... 711/149
2006/0221678 A1 * 10/2006  Bedeschi et al. ............ 365/163
2006/0285420 A1 * 12/2006  Kim et al. ............. 365/230.05

OTHER PUBLICATIONS

Leland Chang, "Stable SRAM Cell Design for the 32nm Node and Beyond", Symposium on VLSI Technology Digest of Technical Papers, 2005, pp. 128-129.

* cited by examiner

*Primary Examiner*—Thong Q Le
(74) *Attorney, Agent, or Firm*—K & L Gates LLP

(57) ABSTRACT

A static random access memory (SRAM) macro includes: a cell array having one or more SRAM cells addressed by a plurality of bit lines and word lines; one or more reference cells coupled to at least one reference bit line and the word lines addressing the SRAM cells; and at least one sense amplifier having a first terminal receiving a sensing current generated by an SRAM cell selected from the cell array and a second terminal receiving a reference current generated by the reference cell controlled by the same word line coupled to the selected SRAM cell for comparing the sensing current to the reference current to generate an output signal representing a logic state of the selected SRAM cell.

14 Claims, 4 Drawing Sheets

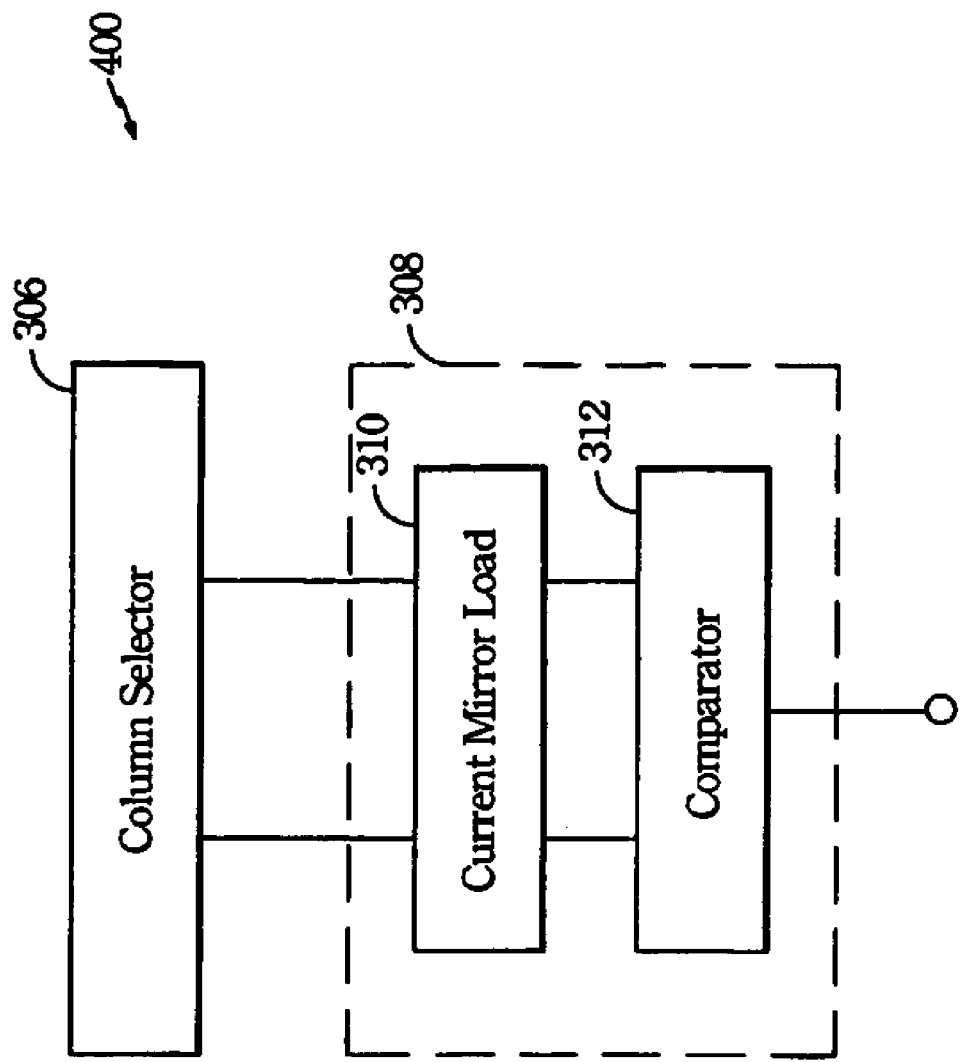

TWO-PORT SRAM WITH A HIGH SPEED SENSING SCHEME

BACKGROUND

The present invention relates generally to integrated circuit designs, and more particularly to a two-port static random access memory (SRAM) device with a high speed sensing scheme.

Static Random access memory (SRAM) is typically used for temporary storage of data in a computer system. SRAM retains its memory state without the need of any data refresh operations as long as it is supplied with power. A SRAM device is comprised of an array of "cells," each of which retains one "bit" of data. A typical SRAM cell may include two cross coupled inverters and two access transistors connecting the inverters to complementary bit-lines. The two access transistors are controlled by word-lines to select the cell for read or write operation. In read operation, the access transistors are switched on to allow the charges retained at storage nodes of the cross coupled inverters to be read via the bit line and its complement. In write operation, the access transistors are switched on and the voltage on the bit line or the complementary bit line is raised to a certain level to flip the memory state of the cell.

FIG. 1 schematically illustrates a typical six transistor SRAM cell 100. The SRAM cell 100 is comprised of PMOS transistors 102 and 104, and NMOS transistors 106, 108, 110 and 112. The PMOS transistor 102 has its source connected to a supply voltage Vcc, and its drain connected to a drain of the NMOS transistor 106. The PMOS transistor 104 has its source connected to the supply voltage Vcc, and its drain connected to a drain of the NMOS transistor 108. The sources of the NMOS transistors 106 and 108 are connected together to a complementary supply voltage, such as ground voltage or Vss. The gates of the PMOS transistor 102 and the NMOS transistor 106 are connected together to a storage node 114, which is further connected to the drains of the PMOS transistor 104 and the NMOS transistor 108. The gates of the PMOS transistor 104 and the NMOS transistor 108 are connected together to a storage node 116, which is further connected to the drains of the PMOS transistor 102 and the NMOS transistor 106. The NMOS transistor 110 connects the storage node 116 to a bit line BL, and the NMOS transistor 112 connects the storage node 114 to a complementary bit line BLB. The gates of the NMOS transistors 110 and 112 are controlled by a word line WL. When the voltage on the word line WL is a logic "1," the NMOS transistors 110 and 112 are turned on to allow a bit of data to be read from or written into the storage nodes 114 and 116 via the bit line BL and the complementary bit line BLB.

One drawback of the typical six transistor SRAM cell 100 is that its operation speed and cell size are strictly limited due to reliability concerns. Moreover, it requires a relatively high supply voltage, which leads to high power consumption.

Conventionally, dual-port SRAM and two-port SRAM have been widely used for high speed applications, wherein a major difference between them is that a dual-port SRAM cell has one pair of bit lines and a complementary bit line for write operation and another pair of bit lines and a complementary bit line for read operation, whereas a two-port SRAM cell has one pair of bit line and complementary bit line for write operation, and only a single bit line for read operation. Although the dual-port SRAM has a faster operation speed, the two-port SRAM is smaller in size and lower in supply voltage. As such, it is desired to improve the operation speed of the two-port SRAM in order to provide a solution for SRAM in high speed and low power consumption applications, without area penalty.

SUMMARY

The present invention discloses a SRAM memory with a high speed sensing scheme. In one embodiment of the invention, the SRAM memory includes a cell array having one or more SRAM cells addressed by a plurality of bit lines and word lines; one or more reference cells coupled to at least one reference bit line and the word lines addressing the SRAM cells; and at least one sense amplifier having a first terminal receiving a sensing current generated by an SRAM cell selected from the cell array and a second terminal receiving a reference current generated by the reference cell controlled by the same word line coupled to the selected SRAM cell for comparing the sensing current to the reference current to generate an output signal representing a logic state of the selected SRAM cell.

The construction and method of operation of the invention, however, together with additional objectives and advantages thereof will be best understood from the following description of specific embodiments when read in connection with the accompanying drawings.

BRIEF DESCRIPTION OF THE DRAWINGS

FIG. 4 illustrates a block diagram showing a column selector and a sense amplifier in the two-port SRAM macro in accordance with one embodiment of the present invention.

DESCRIPTION

This invention is related to a SRAM device with a relatively high speed sensing scheme. The following merely illustrates various embodiments of the present invention for purposes of explaining the principles thereof. It is understood that those skilled in the art of integrated circuit design will be able to devise various equivalents that, although not explicitly described herein, embody the principles of this invention.

References in the specification to "one embodiment," "an embodiment," "an example embodiment," etc., indicate that the embodiment described may include a particular feature, structure or characteristic, but every embodiment may not necessarily include the particular feature, structure or characteristic. Moreover, such phrases are not necessarily referring to the same embodiment. Further, when a particular feature, structure or characteristic is described in connection with an embodiment, it is submitted that it is within the knowledge of one of ordinary skill in the art to implement such feature, structure or characteristic in connection with other embodiments whether or not explicitly described.

Figure 1:
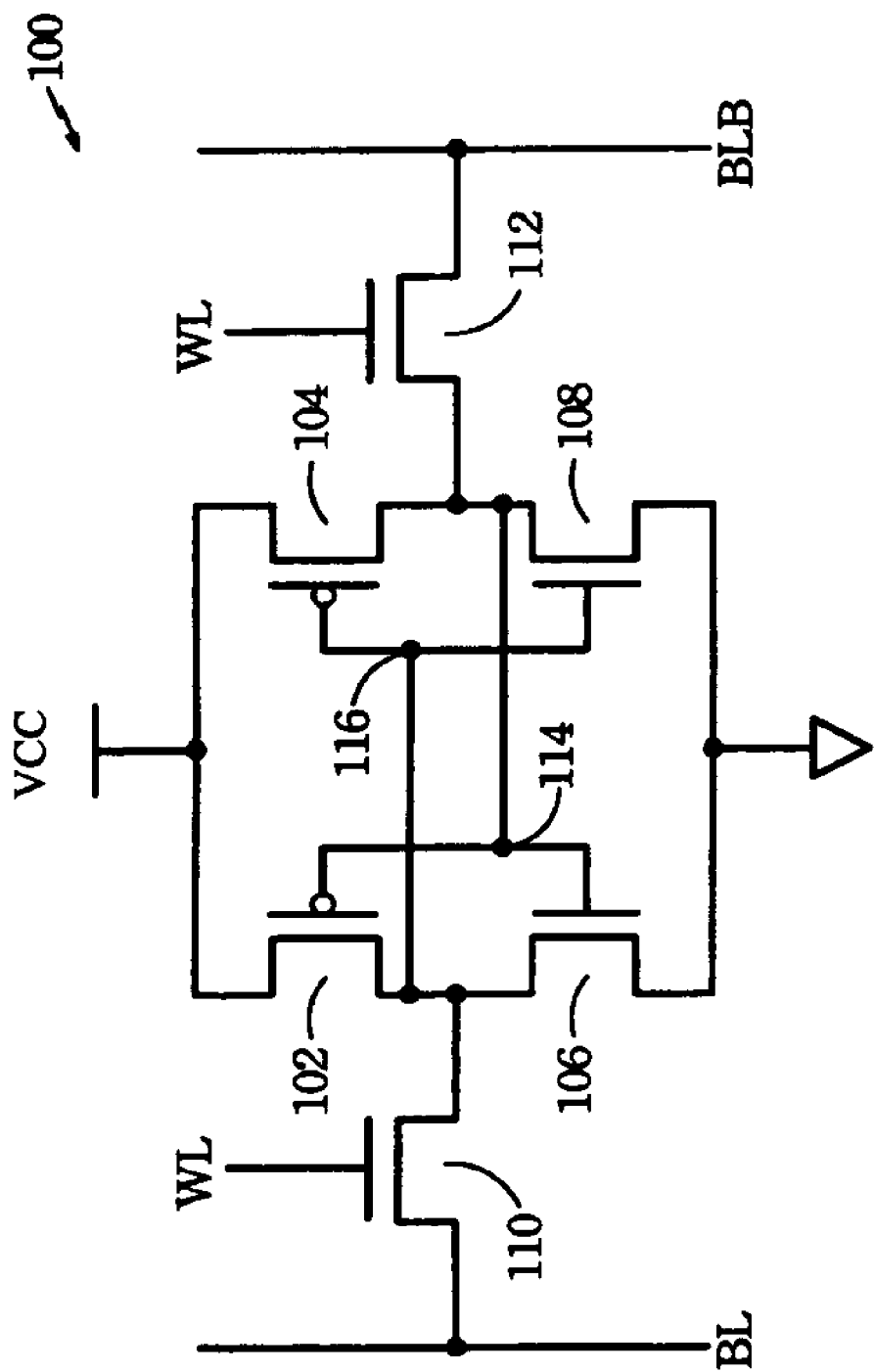
FIG. 1 schematically illustrates a six transistor SRAM cell.
Figure 2:
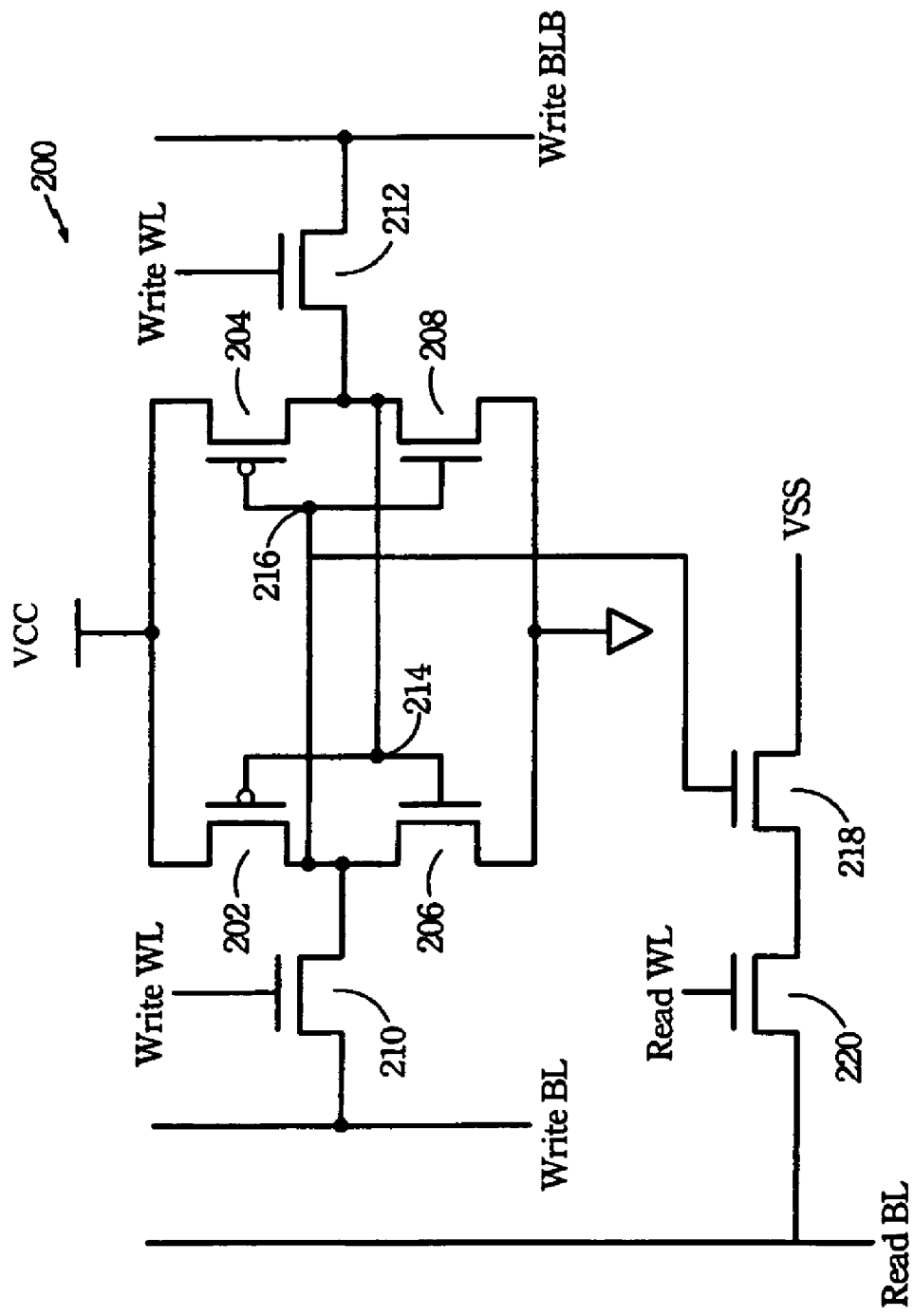
FIG. 2 schematically illustrates a two-port SRAM cell in accordance with one embodiment of the present invention.

FIG. 2 schematically illustrates a two-port SRAM cell 200 in accordance with one embodiment of the present invention. The SRAM cell 200 is comprised of PMOS transistors 202 and 204, and NMOS transistors 206, 208, 210 and 212. The PMOS transistor 202 has its source connected to a supply voltage Vcc, and its drain connected to a drain of the NMOS transistor 206. The PMOS transistor 204 has its source connected to the supply voltage Vcc, and its drain connected to a drain of the NMOS transistor 208. The sources of the NMOS transistors 206 and 208 are connected together to a complementary supply voltage, such as ground voltage or Vss. The gates of the PMOS transistor 202 and the NMOS transistor 206 are connected together to a storage node 214, which is further connected to the drains of the PMOS transistor 204 and the NMOS transistor 208. The gates of the PMOS transistor 204 and the NMOS transistor 208 are connected together to a storage node 216, which is further connected to the drains of the PMOS transistor 202 and the NMOS transistor 206. The NMOS transistor 210 connects the storage node 216 to a write bit line (BL), and the NMOS transistor 212 connects the storage node 214 to a write complementary bit line (BLB). The gates of the NMOS transistors 210 and 212 are controlled by a write word line (WL).

NMOS transistors 218 and 220 are serially coupled between a complementary supply voltage, such as ground or Vss, and a read BL. The NMOS transistor 218 has a source coupled to the complementary supply voltage, a gate coupled to the storage node 216, and a drain coupled to the drain of the NMOS transistor 220. The source of the NMOS transistor 220 is coupled to a read BL, and its gate is controlled by a read WL.

In write operation, the voltage on the write WL is raised above a predetermined level to turn on the NMOS transistors 210 and 212, and the voltage on the read WL is lowered below the predetermined level to turn off the NMOS transistor 220. The write BL is pulled high to charge the storage node 216 and the write BLB is pulled low to discharge the storage node 214, or vice versa, in order to write logic "1" to the cell 200. After the storage nodes 214 and 216 have been fully charged or discharged, the voltage on the write WL is lowered below the predetermined level to turn off the NMOS transistors 210 and 212, such that the logic "1" or "0" can be retained at the node 214 or 216.

In read operation, the voltage on the read WL is raised above a predetermined level to turn on the NMOS transistor 220, and the voltage on the write WL is lowered below a predetermined level to turn off the NMOS transistors 210 and 212. The read BL is pre-charged during the read operation. If the storage node 216 is charged to retain logic "1," the NMOS transistor 218 will be turned on and the voltage on the read BL will be pulled to the complementary supply voltage, such as ground or Vss. If the storage node 216 is discharged to retain logic "0," the NMOS transistor 218 will be turned off and the voltage on the read BL will remain at its pre-charged level. The sensing current on the read BL is then detected by a sense amplifier to determine the logic state of cell 200.

Figure 3:
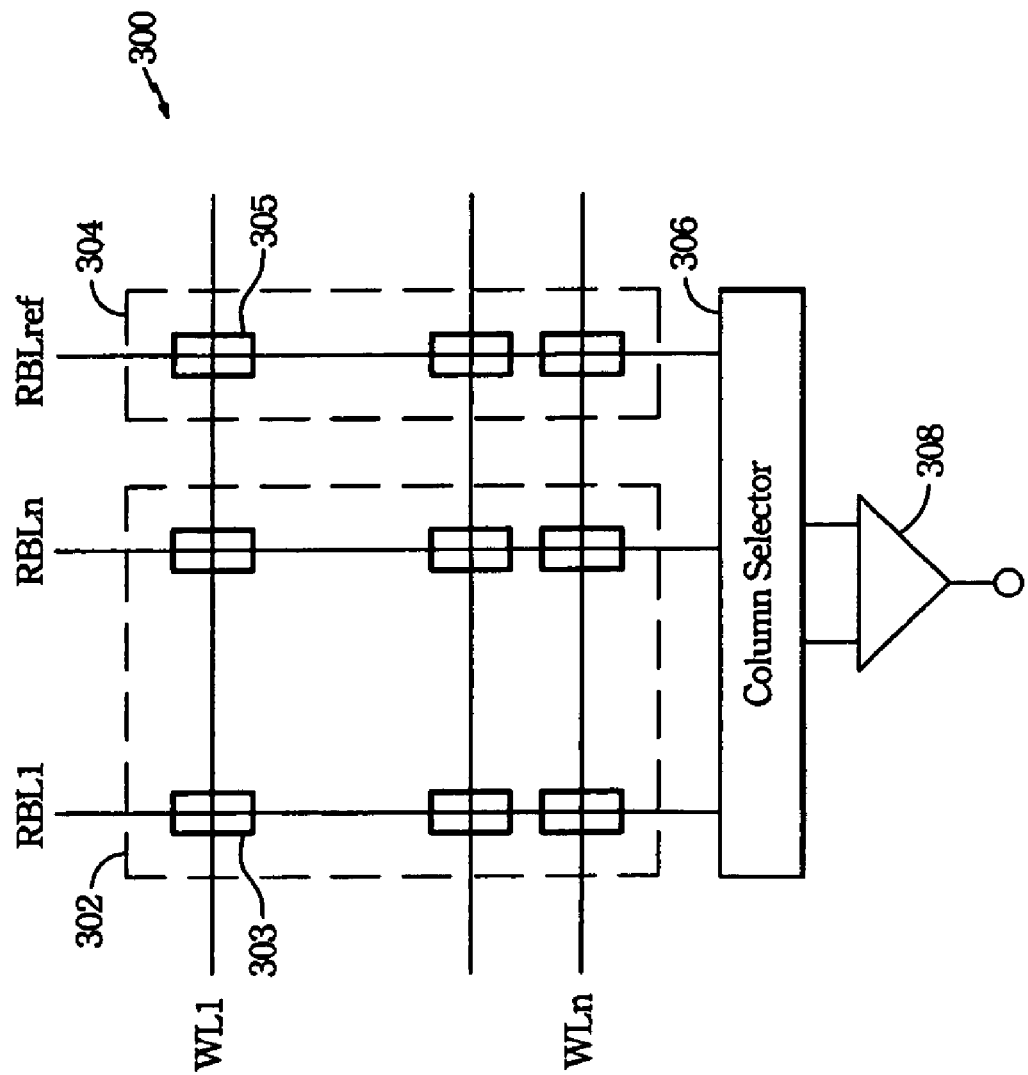
FIG. 3 illustrates a two-port SRAM macro in accordance with one embodiment of the present invention.

FIG. 3 illustrates a two-port SRAM macro 300 in accordance with one embodiment of the present invention. The two-port SRAM macro 300 is comprised of a cell array 302, a set of reference cells 304, a column selector 306, and a sense amplifier 308. The cell array 302 includes a plurality of two-port SRAM cells 303 arranged in columns and rows. The cells in the same column are connected by a read bit line, which is labeled from the left to the right as RBL1, . . . , RBLn. The cells in the same row are connected to a read word line, which is labeled from the top to the bottom as WL1, . . . , WLn. For simplicity of illustration, the write bit lines and their complements are omitted from the drawing.

The set of reference cells 304 includes a plurality of reference cells 305 arranged in a single column or multiple columns. In this embodiment, the reference cells 305 are arranged in a single column with an equal number of rows as that of the cell array 302. The reference cells 305 are connected by a read reference bit line (RBLref) separate from the read bit lines RBL1, . . . , RBLn for the cell array 302. Each reference cell 305 is coupled to the read word line as the two-port SRAM cells are in the same row. For example, the read word line WL1 is coupled to all the two-port SRAM cells 303 and the reference cell 305 in the top row. The reference cell 305 is designed to generate a reference current between a sensing current generated by a two-port SRAM cell 303 that retains logic "1" and a sensing current generate by a two-port SRAM cell 303 that retains logic "0." Such reference cell 305 can be implemented by changing the design rules for regular two-port SRAM cells 303 or simply by a switched resistance circuit.

The column selector 306 is coupled among the cell array 302, the set of reference cells 304, and the sense amplifier 308. The inputs of the column selector 306 are connected to the read bit lines RBL1, . . . , RBLn, and the read reference bit line RBLref. The outputs of the column selector 306 are coupled to input terminals of the sense amplifier 308. During read operation, the column selector 306 selectively passes the sensing current on a read bit line of a selected two-port SRAM cell 303 and the reference current on a reference bit line of a selected reference cell 305 to the sense amplifier 308.

The sense amplifier 308 compares the sensing current received and the reference current received from the column selector 306 to generate an output signal representing the logic state of the selected two-port SRAM cell 303. If the sensing current is larger than the reference current, the sense amplifier 308 generates an output signal with a high logic state (i.e., logic "1"). If the sensing current is smaller than the reference current, the sense amplifier 308 generates an output signal with a low logic signal (i.e., logic "0").

FIG. 4 illustrates a block diagram 400 showing a column selector 306 and a sense amplifier 308 in the two-port SRAM macro in accordance with one embodiment of the present invention. The sense amplifier 308 is further comprised of a current mirror load 310 and a comparator 312. The current mirror load 310 receives the sensing current and the reference current from the column selector 306, and converts them into a sensing voltage and a reference voltage, respectively. The comparator 312 receives the sensing voltage and the reference voltage, and compares them to generate an output signal representing the logic state of the selected two-port SRAM cell. If the sensing voltage is larger than the reference voltage, the output signal will be in a high logic state. If the sensing voltage is smaller than the reference voltage, the output signal will be in a low logic state. It is understood that the construction of the current mirror load 310 and the comparator 312 can be readily appreciated by those skilled in the art of integrated circuit design. Thus, the details of the current mirror load 310 and the comparator 312 are hereby omitted from the drawing.

By introducing the reference cells, the read operation speed and sensing margin of the two-port SRAM can be improved significantly, without a substantial penalty on the device area. It is shown that the read operation speed of the proposed two-port SRAM is about twice to ten times faster than the conventional six transistor SRAM implemented with a single ended sensing scheme. Compared to the conventional dual-port SRAM, the proposed two-port SRAM can achieve a similar read operation speed with a less size penalty and lower supply voltage. As such, the proposed two-port SRAM are particularly suitable for high speed and lower power consumption applications.

The above illustration provides many different embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A static random access memory (SRAM) macro comprising:
    a cell array having one or more two-port SRAM cells addressed by a plurality of bit lines and word lines including write bit lines, complementary write bit lines, and write word lines for write operation and read bit lines and read word lines for read operation;
    a plurality of reference cells coupled to a read reference bit line separate from the plurality of the bit lines addressing the SRAM cells and a plurality of read word lines for read operation of the SRAM cells; and
    at least one sense amplifier having a first terminal receiving a sensing current generated by an SRAM cell selected from the cell array and a second terminal receiving a reference current generated by the reference cell controlled by the same word line coupled to the selected SRAM cell for comparing the sensing current to the reference current to generate an output signal representing a logic state of the selected SRAM cell.

2. The SRAM macro of claim 1, wherein the reference bit line is not connected to any SRAM cell in the cell array.

3. The SRAM macro of claim 1, wherein the reference current is greater than the sensing current when the selected SRAM cell has a low logic state.

4. The SRAM macro of claim 1, wherein the reference current is smaller than the sensing current when the selected SRAM cell has a high logic state.

5. The SRAM macro of claim 1, further comprising a column selector coupled among the cell array, the reference cells and the sense amplifier for selectively passing the sensing current and the reference current to the sense amplifier.

6. The SRAM macro of claim 5, wherein the sense amplifier further comprises a current mirror load coupled to the column selector for converting the sensing current and the reference current into a sensing voltage and a reference voltage, respectively.

7. The SRAM macro of claim 6, wherein the sense amplifier further comprises a comparator for comparing the sensing voltage with the reference voltage to generate a high output signal when the sensing voltage is higher than the reference voltage, and a low output signal when the sensing voltage is lower than the reference voltage.

8. A two-port static random access memory (SRAM) device comprising:
    a cell array having one or more two-port SRAM cells addressed by a plurality of bit lines and word lines including write bit lines, complementary write bit lines, and write word lines for write operation and read bit lines and read word lines for read operation;
    a plurality of reference cells coupled to a read reference bit line separate from the plurality of the bit lines addressing the SRAM cells and a plurality of read word lines for read operation of the SRAM cells; and
    at least one sense amplifier having a first terminal receiving a sensing current generated by a two-port SRAM cell selected from the cell array and a second terminal receiving a reference current generated by the reference cell controlled by the same word line coupled to the selected two-port SRAM cell for comparing the sensing current to the reference current to generate an output signal representing a logic state of the selected two-port SRAM cell.

9. The two-port SRAM device of claim 8, wherein the reference bit line is not connected to any two-port SRAM cell in the cell array.

10. The two-port SRAM device of claim 8, wherein the reference current is greater than the sensing current when the selected two-port SRAM cell has a low logic state.

11. The two-port SRAM device of claim 8, wherein the reference current is smaller than the sensing current when the selected two-port SRAM cell has a high logic state.

12. The two-port SRAM device of claim 8, further comprising a column selector coupled among the cell array, the reference cells and the sense amplifier for selectively passing the sensing current and the reference current to the sense amplifier.

13. The two-port SRAM device of claim 12, wherein the sense amplifier further comprises a current mirror load coupled to the column selector for converting the sensing current and the reference current into a sensing voltage and a reference voltage, respectively.

14. The two-port SRAM device of claim 13, wherein the sense amplifier further comprises a comparator for comparing the sensing voltage with the reference voltage to generate a high output signal when the sensing voltage is higher than the reference voltage, and a low output signal when the sensing voltage is lower than the reference voltage.

* * * * *